United States Patent
Fitz et al.

(10) Patent No.: US 11,934,751 B2
(45) Date of Patent: Mar. 19, 2024

(54) VIRTUAL CURRENT REPRESENTATION OF MAGNETIC FIELDS FOR ELECTRIC MOTOR DESIGN

(71) Applicant: Monumo Limited, Saffron Walden (GB)

(72) Inventors: Stephen Mark Fitz, Saffron Walden (GB); Jaroslaw Pawel Rzepecki, Saffron Walden (GB)

(73) Assignee: Monumo Limited, Essex (GB)

( * ) Notice: Subject to any disclaimer, the term of this patent is extended or adjusted under 35 U.S.C. 154(b) by 0 days.

(21) Appl. No.: 18/315,811

(22) Filed: May 11, 2023

(65) Prior Publication Data

US 2023/0367931 A1    Nov. 16, 2023

(30) Foreign Application Priority Data

May 11, 2022    (GB) ...................................... 2206858

(51) Int. Cl.
   *G06F 30/20*    (2020.01)
(52) U.S. Cl.
   CPC .................................. *G06F 30/20* (2020.01)
(58) Field of Classification Search
   CPC .............................. G06F 30/23; G06F 30/30
   See application file for complete search history.

(56) References Cited

U.S. PATENT DOCUMENTS

| | | | |
|---|---|---|---|
| 8,768,677 B2 * | 7/2014 | Teramae | G06F 30/367 703/13 |
| 9,207,289 B2 * | 12/2015 | Shimizu | G01R 33/0064 |
| 10,379,081 B2 * | 8/2019 | Miyazaki | G01R 33/12 |
| 11,074,378 B1 * | 7/2021 | Yamada | G06F 30/30 |
| 2013/0166230 A1 | 6/2013 | Shimizu | |
| 2015/0127283 A1 | 5/2015 | Miyazaki et al. | |

FOREIGN PATENT DOCUMENTS

| | | |
|---|---|---|
| JP | H11146688 A | 5/1999 |
| JP | 2021135774 A | 9/2021 |

OTHER PUBLICATIONS

"An Overview of Analytical Methods for Magnetic Field Computation", Mitrofan Curti et al., 2015 Tenth International Conference on Ecological Vehicles and Renewable Energies (EVER).
Great Britain Search Report for GB Application No. GB2206858.9 dated Nov. 14, 2022.

* cited by examiner

*Primary Examiner* — Andy Ho
(74) *Attorney, Agent, or Firm* — Harness, Dickey & Pierce, P.L.C.

(57) ABSTRACT

A computer-implemented method for simulating a magnetic field within an electromagnetic device for use in evaluating the electromagnetic device. The method comprises: obtaining a digital design of the electromagnetic device, the digital design comprising geometric data representing a geometry of the electromagnetic device and material data representing material properties of the electromagnetic device; obtaining magnetic field data representing a magnetic field pattern that would be generated through operation of the digital design of the electromagnetic device; and converting the magnetic field data into virtual current data, wherein the virtual current data represents the magnetic field pattern as one or more virtual currents that would create an estimated magnetic field pattern that substantially matches the magnetic field pattern.

15 Claims, 5 Drawing Sheets

```
┌─────────────────────────────────────────────────────────────────────┐
│ Obtain magnetic field data representing magnetic field pattern that would be │
│   generated through operation of digital design of electromagnetic device    │
└─────────────────────────────────────────────────────────────────────┘
                                    ╲―122
                          │
                          ▼
          ┌─────────────────────────────────────────┐
          │ Convert magnetic field data into virtual current data │
          └─────────────────────────────────────────┘
                                    ╲―124
                          │
                          ▼
          ┌─────────────────────────────────────────┐
          │   Determine one or more performance parameters   │
          │         based on the virtual current data        │
          └─────────────────────────────────────────┘
                                    ╲―126
```

VIRTUAL CURRENT REPRESENTATION OF MAGNETIC FIELDS FOR ELECTRIC MOTOR DESIGN

CROSS-REFERENCE TO RELATED APPLICATIONS

This application claims priority to and the benefit of United Kingdom Patent Application No. 2206858.9 filed on May 11, 2022, the entire contents of each of which are incorporated herein by reference.

TECHNICAL FIELD

The present disclosure relates to computer-implemented methods for simulating magnetic fields within electromagnetic devices. In particular, but without limitation, this disclosure relates to computer-implemented methods for simulating magnetic fields within different digital designs of electric motors in order to determine the motor designs with improved performance.

BACKGROUND

Electromagnetic devices are any devices that make use of the interaction between magnetism and electricity. Examples of electromagnetic devices include electric motors and generators. Improved electromagnetic devices such as electric motors or electric generators offer an opportunity to utilise green energy more efficiently. For instance, many renewable energy sources rely on electromagnetic power generation. Equally, as reliance on fossil fuels is reducing, the efficiency of electric motors is becoming more important as electric vehicles are becoming more prevalent.

Electric motors are able to generate torque from electrical inputs through the manipulation of magnetic fields generated by electromagnets. Similarly, electrical generators, such as dynamos or alternators, are able to generate electrical current from torque through induction caused by relative movement between conductors and magnetic fields.

Accordingly, electromagnetic devices generally rely on relative movement between one or more electrical conductors and a magnetic field.

SUMMARY

Embodiments relate to the simulation of magnetic fields within electromagnetic devices and, in particular, the efficient conversion of magnetic field data into one or more virtual currents to allow efficient storage and subsequent calculations based on the magnetic field represented by the one or more virtual currents. Specific embodiments apply the calculated virtual currents to the evaluation of performance of various designs of electromagnetic devices and the optimization of such designs to improve performance. The optimized designs can then be output for manufacture. This can be applied to the design and manufacture of more efficient electric generators or electric motors.

According to a first aspect there is provided a computer-implemented method for simulating a magnetic field within an electromagnetic device for use in evaluating the electromagnetic device. The method comprises: obtaining magnetic field data representing a magnetic field pattern that would be generated through operation of the electromagnetic device; and converting the magnetic field data into virtual current data, wherein the virtual current data represents the magnetic field pattern as one or more virtual currents that would create an estimated magnetic field pattern that substantially matches the magnetic field pattern.

The method may comprise obtaining a digital design of the electromagnetic device, the digital design comprising geometric data representing a geometry of the electromagnetic device and material data representing material properties of the electromagnetic device. The magnetic field data may represent the magnetic field pattern that would be generated through operation of the digital design of the electromagnetic device. The geometry and material data may be design parameters. The magnetic field data may be determined through simulation of the magnetic field within the electromagnetic device. The simulation may calculate the expected magnetic field at various positions within and around the electromagnetic device. This may require numerical calculation of the result of differential equations. These differential equations may be solved through various methods, for instance, finite element methods (FEM), finite difference methods, boundary element methods (BEM), or similar. The simulation can be computationally expensive to calculate, and the full magnetic field pattern can require a large amount of storage.

A virtual current may be a parameterization of the magnetic field, but it need not represent an actual current that would be flowing in the use of the design. Instead, a virtual current may be a proxy for representing the magnetic field that would be generated within the design in use in real life. The virtual currents represent an efficient means of representing the magnetic field pattern without having to store the full shape of the magnetic field. Instead, the effect of the magnetic field at a given point can be determined as needed by summing the effect of each virtual current on that given point. This allows the magnetic field to be stored more efficiently and also allows subsequent calculations to be performed more efficiently. Importantly, the virtual current representation can allow subsequent calculations to be performed within memory constricted components, such as graphical processing units (GPUs), central processing units (CPUs) and/or field programmable arrays (FPGAs), which may not have sufficient memory storage to load the full magnetic field pattern.

According to an embodiment the one or more virtual currents comprise one or more virtual current filaments, each virtual current filament being a straight filament running perpendicular to a corresponding surface of the electromagnetic device through which the virtual current filament passes.

The magnetic field pattern may be represented by a set of virtual currents, each being represented by a corresponding current value, position and, in some circumstances, direction.

According to an embodiment, converting the magnetic field data into virtual current data comprises fitting the estimated magnetic field pattern to the magnetic field pattern by varying one or more virtual current parameters. The one or more virtual current parameters may be selected from a group comprising: a number of virtual currents; for each virtual current, a position of the virtual current; for each virtual current, a direction of the virtual current; and for each virtual current, a current magnitude.

Fitting the estimated magnetic field pattern to the magnetic field pattern may comprise adjusting the one or more virtual current parameters to minimize an error between the estimated magnetic field pattern and the magnetic field pattern. The error may be a sum of squared errors. That is, the fitting may be a least squares fitting method.

Fitting the estimated magnetic field pattern to the magnetic field pattern may comprise, in response to determining that the error exceeds an error threshold, increasing a number of virtual currents and refitting the estimated magnetic field pattern based on the increased number of virtual currents.

Increasing a number of virtual currents may comprise: identifying one or more regions in which a corresponding local error between the estimated magnetic field pattern and the magnetic field pattern either exceeds a local error threshold or is higher than a predefined number or proportion of other regions; and for each identified region, increasing a number of virtual currents within the identified region.

The method may further comprise: determining, based on the virtual current data, one or more performance parameters for the digital design of the electromagnetic device, the one or more performance parameters representing performance of the electromagnetic device through an interaction between the electromagnetic device and the estimated magnetic field pattern represented by the virtual current data. The one or more performance parameters may be selected from a group comprising: one or more electromagnetic performance parameters; one or more mechanical performance parameters; one or more thermal performance parameters; and one or more energy performance parameters.

Determining one or more performance parameters may comprise loading the virtual currents into one or more graphical processing units (GPUs), central processing units (CPUs) and/or field programmable arrays (FPGAs).

The method may further comprise determining an updated digital design for the electromagnetic device, wherein determining the updated digital design comprises altering one or more design parameters of the electromagnetic device based on the one or more performance parameters. The one or more design parameters may be selected from a group comprising: the geometry of the electromagnetic device; the material properties of the electromagnetic device; and an input for driving the electromagnetic device.

The method may comprise, after altering one or both of the geometry and the material properties are altered, obtaining an updated magnetic field pattern for the updated digital design, converting the updated magnetic field pattern into updated virtual currents and determining one or more updated performance parameters for the updated digital design.

The method may comprise, after altering the input for driving the electromagnetic device, determining one or more updated performance parameters for the altered input. In one embodiment, the magnetic field and virtual currents may not need to be updated after an update to only the input. This is because the magnetic potential may scale linearly with current. Accordingly, changes in input current to an electromagnetic system can be represented through changes to the amplitude of the virtual currents without requiring recalculation of the magnetic field from first principles. This may be achieved by scaling each virtual current by an equivalent amount to a scale of change to the input currents.

Determining an updated digital design for the electromagnetic device may comprise one or more optimization steps that adjust at least one of the one or more design parameters with an objective of improving at least one of the one or more performance parameters.

The method may further comprise outputting the updated digital design of the electromagnetic device for manufacture.

The method may further comprise controlling one or more manufacturing devices to manufacture one or more electromagnetic devices according to the updated digital design.

The electromagnetic device may be an electric motor or an electric generator.

According to one embodiment: the electromagnetic device comprises a stator and a rotor; the geometric data represents multiple geometries of the electromagnetic device, each geometry relating to one of a plurality of relative orientations of the stator and rotor; obtaining magnetic field data representing a magnetic field pattern that would be generated through operation of the electromagnetic device comprises obtaining, for each of a plurality of relative orientations of the stator and rotor, magnetic field data representing a magnetic field pattern for the corresponding relative orientation of the stator and rotor; and converting the magnetic field data comprises converting each magnetic field pattern into corresponding virtual current data representing the magnetic field pattern as one or more virtual currents that would create an estimated magnetic field pattern that substantially matches the corresponding magnetic field pattern.

According to an embodiment there is provided a method of designing and manufacturing an electromagnetic device, the method comprising: implementing a method as described herein to determine an updated digital design; and manufacturing an electromagnetic device according to the updated digital design.

According to an embodiment there is provided a computing system comprising one or more processors configured to implement any of the methods described herein.

According to an embodiment there is provided a computer readable medium comprising executable instructions that, when executed by a processor, cause the processor to implement any of the methods described herein.

BRIEF DESCRIPTION OF THE DRAWINGS

Arrangements of the present invention will be understood and appreciated more fully from the following detailed description, made by way of example only and taken in conjunction with drawings in which:

FIG. 3 shows a method for simulating operation of digital design to determine one or more performance parameters;

DETAILED DESCRIPTION

Figure 1:
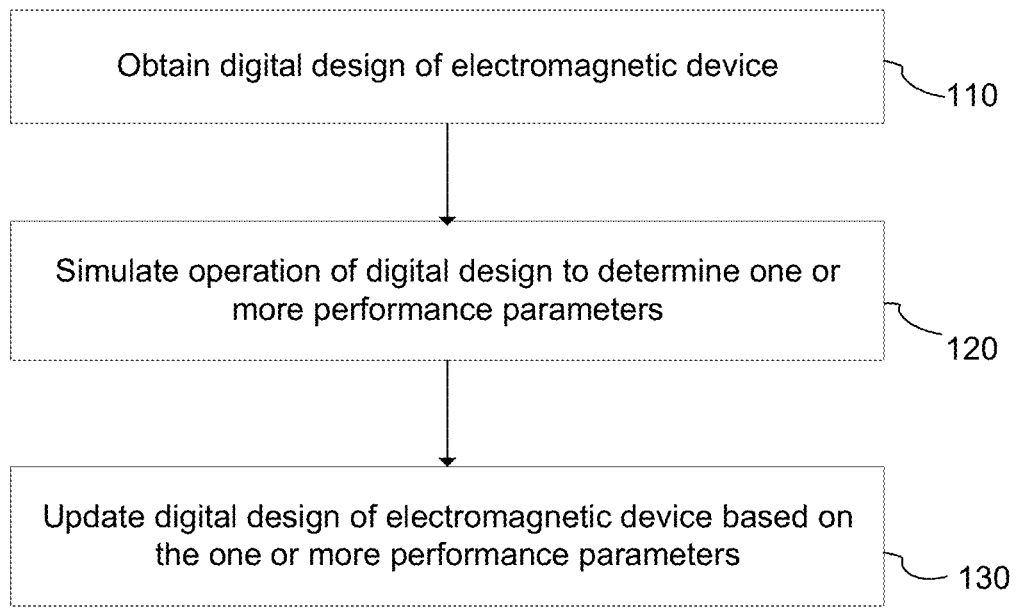
FIG. 1 shows a method for optimizing a design of an electromagnetic device.

Electromagnetic devices generally rely on the relative movement between one or more electrical conductors and a magnetic field. Accordingly, when designing an electromagnetic device, such as an electric motor or electromagnetic generator, it is important to consider the magnetic field being generated during use.

Computational methods can be used in order to optimize the design of electromagnetic devices. For instance, an improved design for an electromagnetic device can be determined by accurately simulating the magnetic field within the device during use, assessing the performance of the device (e.g. through calculation of one or more performance parameters based on the simulated magnetic field) and optimizing the design of the device based on the simulated performance.

In particular, machine learning methods, such as reinforcement learning or genetic algorithm(s), can be applied to the computer simulation of the electromagnetic device in order to optimize the design for improved performance. For instance, by optimizing the design of an electric motor (e.g. for an electric vehicle), power consumption can be reduced, thereby improving run-times and reducing the demand on renewable (and non-renewable) sources of energy.

Having said this, the complexity of the geometry of magnetic fields can make is computationally difficult to simulate magnetic fields and perform subsequent calculations on magnetic fields.

An important aspect of simulating the performance of an electromagnetic device is the simulation of the magnetic field within the device. The simulation may calculate the expected magnetic field at various positions within and around the electromagnetic device. This may require numerical calculation of the result of differential equations. These differential equations may be solved through various methods, for instance, finite element methods (FEM), finite difference methods, boundary element methods (BEM) or similar. An overview of various simulation methods for magnetic field computation is provided in "An Overview of Analytical Methods for Magnetic Field Computation", Mitrofan Curti et al., 2015 Tenth International Conference on Ecological Vehicles and Renewable Energies (EVER), which is hereby incorporated by reference. These simulation methods can be computationally expensive to calculate, store and perform subsequent calculations upon.

To solve the above problem, embodiments described herein propose a novel representation of magnetic fields that represents magnetic fields in a more efficient manner and are easier to subsequently manipulate. Specifically, embodiments represent the magnetic field within a device as a set of virtual currents. These currents are virtual in that they do not represent a current that would be physically generated during operation in the device. Instead, they represent imaginary currents that would generate a magnetic field that is equivalent to that generated during operation, if they were to exist.

By representing a magnetic field as a set of virtual currents, the amount of data required to store a representation of the magnetic field is greatly reduced. For instance, instead of storing the vectors representing the magnetic field at each location within the field, a set of virtual currents are stored that are represented by an amplitude, a position and a direction. These virtual currents parameterise the magnetic field and can be used to calculate the magnetic field at any location within the device. Furthermore, the electromagnetic field need only be calculated in specific places of interest (such as within magnetic coils or an air gap) instead of requiring calculation and storage of the electromagnetic field across the whole device.

Importantly, the reduction in the size of the data required to represent the magnetic field allows the magnetic field to be loaded onto memory-limited components, such as graphical processing units (GPUs), field programmable arrays (FPGAs) and/or central processing units (CPUs). This means that, contrary to alternative methods, the whole magnetic field can be loaded and processed efficiently within particular hardware within a computer. This greatly reduces the computational cost and time required to perform calculations on the magnetic field (for instance, to optimize the electromagnetic device as shown in FIG. 1).

In addition to the above, by representing the magnetic field as a set of virtual currents, calculations based on the magnetic field are simplified. For instance, it can be possible to quickly obtain the magnetic field after updating input parameters without the need for extensive computation. The virtual current representation allows for easy scaling of the magnetic field with changes to the input parameters without the need to recalculate the magnetic field from first principles (e.g. via FEM).

Once the virtual currents are calculated, subsequent calculations can be made as if the whole region was occupied by only air (that is, there is no need to take into account magnetic materials or boundaries). The mapping between the virtual currents and the performance parameters (e.g. torque, potential etc.) is then straightforward and can be calculated using simple analytical expressions. For instance, for a motor, instantaneous input current can be transformed into instantaneous performance parameters at each time step with low computational effort.

FIG. 1 shows a method for optimizing a design of an electromagnetic device.

The method 100 includes three steps. First, a digital design of the electromagnetic device is obtained 110. Then operation of the digital design is simulated in order to determine one or more performance parameters 120. Then an updated digital design is determined based on the one or more performance parameters 130. The method 100 may be repeated over multiple iterations (optimization steps) in order to converge on an optimized design (set of one or more design parameters). Accordingly, during a first iteration, the one or more design parameters may be initialized (e.g. predefined by a user) but over later iterations the design parameters may be obtained through the update step 130.

The digital design may specify one or more design parameters of the electromagnetic device. The one or more design parameters may include one or more geometric parameters specifying a geometry of the electromagnetic design, one or more material parameters specifying one or more material properties of the electromagnetic device and/or one or more input parameters specifying one or more inputs during operation of the electromagnetic device.

The one or more geometric parameters may specify a geometry of magnetic portions and/or a geometry of conductive portions of the device. For instance, where the electromagnetic device is a motor or generator, the geometric properties may specify a shape of a rotor, a shape of a stator, a relative orientation of the rotor and stator, and/or a shape of one or more coils within the electromagnetic device. The shape of the stator may include a number of stator poles and/or the shape of stator poles. The shape of the rotor may include the number of rotor poles and/or the shape of the rotor poles. The geometric properties may also specify a shape of one or more air gaps between the stator and rotor. The shape of the one or more coils may specify a conductor radius, a winding radius, a number of windings, a position and/or an orientation for each of one or more coils.

The material properties may include one or more of electrical properties, magnetic properties or thermal properties of various portions of the electromagnetic device (e.g. as defined by the materials intended to be used in the manufacture of the device). Electrical properties may include conductance, resistance, conductivity and/or resistivity. Magnetic properties may include magnetic permeability, magnetization, magnetic susceptibility, magnetic reluctance, retentivity and/or coercivity. Thermal properties may include thermal conductance, thermal resistance, thermal conductivity, thermal resistivity, thermal insulance and/or specific heat capacity.

The one or more input parameters may specify one or more inputs during operation of the electromagnetic device. For instance, for an electric motor, the one or more input parameters may include one or more electrical inputs (e.g. for driving one or more electromagnetic coils). Similarly, for a generator, the one or more input parameters may include one or more driving forces (e.g. a torque applied to the rotor). The one or more input parameters may change over time. That is, the one or more input parameters may form one or more input waveforms over time.

The one or more design parameters allow the operation of the design of the electromagnetic device to be simulated. During the simulation 120, the magnetic field (e.g. the magnetic vector potential) within the electromagnetic device is simulated. The details of the magnetic field simulation shall be discussed in more detail below. Once the magnetic field is simulated, this field may be utilized to determine one or more performance parameters.

The simulation may include the simulation of electrical inductance and/or electrical conductance within the device. The simulation may also include the simulation of thermal heating and/or cooling within the device (e.g. due to friction and/or resistance). In addition, the simulation may include the simulation of forces exerted on or by the device during operation (e.g. torque generated by a motor, torque input into a generator, magnetic forces generated within the electromagnetic device, etc.).

The one or more performance parameters may include one or more parameters selected from the following group: magnetic flux density (B) at one or more locations, magnetic field strength (H) at one or more locations, the magnetic vector potential (A) at one or more locations, one or more losses (e.g. heat loss, eddy current loss, etc.), and one or more forces acting on the electromagnetic device (e.g. torque, one or more forces acting on a rotor, one or more forces acting on a stator).

Following the simulation, the digital design is updated based on the one or more performance parameters. This might include calculating one or more evaluation parameters based on the one or more performance parameters. The one or more evaluation parameters may include efficiency, torque (e.g. starting torque, maximum torque, average torque, torque ripple, etc.), core saturation, counter-electromotive force (back electromotive force) and/or heat distribution. One or more performance parameters that are not directly based on the electromagnetic performance of the device may also be utilized in the update, including the weight and/or size of the device.

In order to evaluate the performance of an electromagnetic device having moving parts (e.g. a motor or generator), the magnetic field may need to be simulated for various geometric configurations (e.g. different rotational positions), and then the design performance assessed over all configurations.

The update may include inputting the one or more design parameters and the one or more performance parameters into a neural network and determining an updated set of one or more design parameters using the neural network. The neural network may attempt to update the one or more design parameters based on an objective function. For instance, reinforcement learning may be utilised, where a reward may be generated based on the one or more performance parameters (or the one or more evaluation parameters, where these are calculated). Similarly, a genetic algorithm may be utilised to update the one or more design parameters. Alternative optimization methods include Baysian optimization, random search optimization and grid search optimization.

Not all of the one or more design parameters need to be updated. For instance, in one embodiment, one or more input parameters may be updated whilst keeping the geometric and material parameters constant. That is, the method of driving or running the electromagnetic device may be optimized whilst keeping the physical parameters of the device constant. For instance, when optimizing a motor design, an optimal waveform for driving the motor (e.g. one or more current and/or a voltage waveforms) may be determined for optimally driving the motor. Advantageously, it can be possible to quickly obtain the magnetic field after updating input parameters without the need for extensive computation. The virtual current representation allows for easy scaling of the magnetic field with changes to the input parameters without the need to recalculate the magnetic field from first principles (e.g. via FEM). Accordingly, an optimal set of one or more input parameters may be determined for a given set of physical parameters efficiently using the virtual current representation of the magnetic field.

Conversely, the physical parameters (e.g. geometric and/or material parameters) may be updated whilst keeping the input parameters constant. The method may alternate between updates of each set of parameters in order to find an optimal set of parameters, or may optimize all parameters in each update.

Once an updated set of one or more design parameters is determined, the one or more design parameters may be output (e.g. for storage and/or for manufacture of the device) or may be utilized in another iteration of the method 100 to iteratively update (optimize) the one or more design parameters.

When the physical characteristics (e.g. geometry and/or material properties) of the design have been updated, they may be output for manufacture (e.g. by an additive manufacturing device, or another automated manufacturing device). This may include outputting computer readable instructions for controlling a manufacturing device to manufacture the electromagnetic device.

Where the input parameters (for operating the electromagnetic device) are optimized, they may be output to a controller configured to control an electromagnetic device according to the input parameters.

By more effectively modelling magnetic fields within an electromagnetic device, the design of the electromagnetic device may be effectively optimized. This can be particularly advantageous for motors for electric vehicles, as the particular characteristics may need to be optimized to improve performance across a wide range of variable speeds (e.g. compared to other applications where motors may be driven at a constant speed). There is, in particular, a need to develop motors (e.g. for electric vehicles) that have improved efficiency at low speeds. In addition, as rare-earth magnets can be associated with a large financial and environmental cost, there is a desire to develop electromagnetic devices that avoid or reduce the need for rare earth magnets.

As discussed above, embodiments efficiently represent magnetic fields within electromagnetic devices as sets of virtual currents. This makes subsequent calculations on these magnetic fields easier and more efficient.

For clarity, the following description shall explain the methodology with reference to the modelling of magnetic fields within a motor. Having said this, the methodology is generally applicable to any type of electromagnetic device, and is not limited to only being applied to the modelling of motors. Furthermore, whilst a particular motor design is discussed herein, this methodology is applicable to a variety of electromagnetic motor designs, such as brushed (DC) motors, switched reluctance motors, etc.

Figure 2:
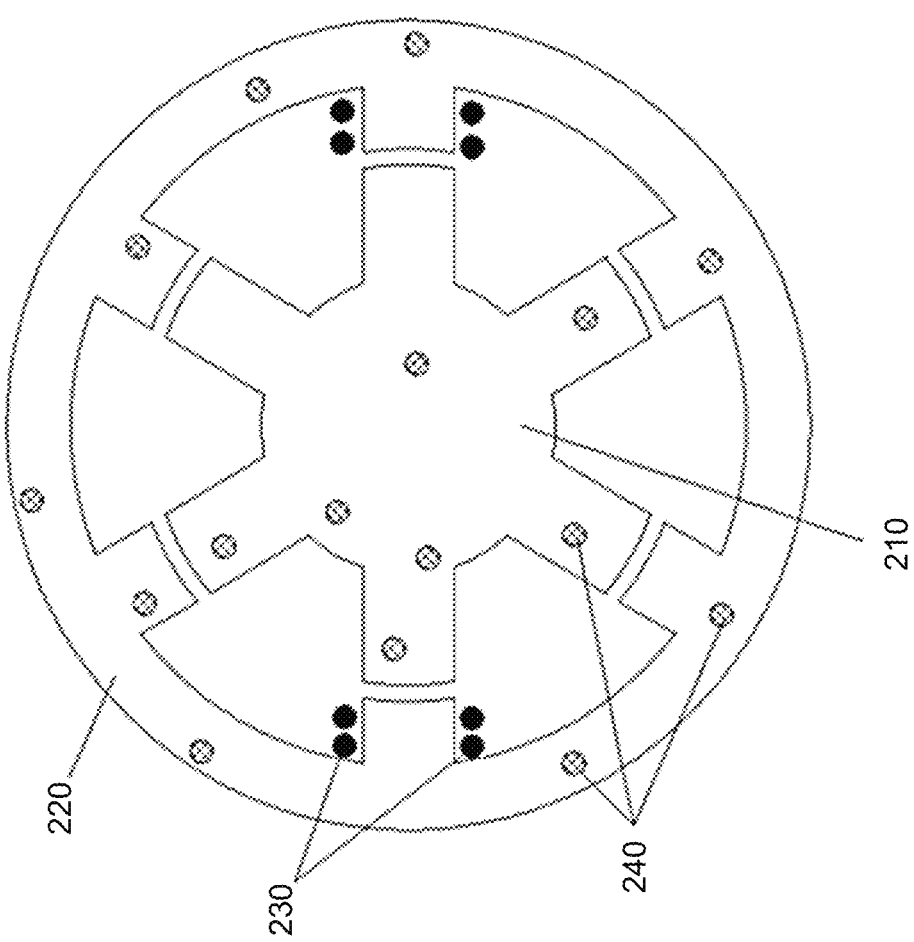
FIG. 2 is a cross-sectional view showing a motor and a set of virtual currents.

FIG. 2 is a cross-sectional view showing a motor and a set of virtual currents. The motor 200 includes a rotor 210, a stator 220 and coils 230. The rotor 210 is mounted on an axle such that it is configured to rotate within the stator 220. The stator 220 surrounds the rotor 210. Each of the rotor 210 and stator 220 include bars that protrude radially. In the case of the rotor 210, the bars protrude radially outward towards the stator 220. In the case of the stator 220, the bars protrude radially inward towards the rotor 210. In this example, the number of bars on the rotor 210 is the same as the number of bars on the stator 220. In this case, there are six bars on each of the rotor 210 and stator 220.

A coil 230 is wound around each of the bars on the stator 220 (in FIG. 2, only two coils shown). These coils 230 are conductive, and are configured to provide an electromagnetic field within the motor 200 when driven by a current. Similar coils may be provided on the rotor 210 (not shown). By selectively driving the coils 230, the magnetic field within the motor 200 may be rotated, causing the rotor 210 to be driven to rotate. Torque from the motor 200 can be output through an axle connected to the rotor 210 (not shown).

As discussed above, the magnetic field within the motor 200 can be modelled using computational methods, such as finite element methods (FEM), finite difference methods or boundary element methods (BEM). As the magnetic field within the motor will change depending on the relative rotation of the rotor 210 and stator 220, a magnetic field will need to be recalculated for relative rotation. In practice, the full 360° of rotation can be divided up into incremental steps, and a magnetic field can be calculated for each step. Each relative orientation of the stator 220 and rotor 210 can be considered a different geometrical configuration. Accordingly, the relative orientation can be a design parameter that is input into the calculation of the magnetic field.

As discussed above, the magnetic field within the motor 200 can be represented by a set of virtual currents 240. These virtual currents may be imaginary, infinitely long wires. Position, orientation and current for each virtual current can be calculated such that the virtual currents produce a magnetic field that is equivalent to the magnetic field for the motor 200 (in this orientation). These parameters (position, orientation and current) may be determined through fitting methods, such as least squares fitting.

Each of the virtual currents may be constricted to run perpendicular to the geometry of the motor 200 (e.g. perpendicular to a surface through which the virtual current passes). The position of virtual currents may be constrained such that each virtual current runs through a solid portion of the motor 200 (e.g. the rotor 210 or stator 220).

In one embodiment, as the magnetic field may be largely uniform along the length of the motor (i.e. along a z-axis running parallel to the axle of the motor), the all currents within the motor (both virtual and simulated currents) may be constrained to run parallel to the z-axis, and therefore the calculation of the magnetic field and any subsequent calculations can be simplified through being constrained to a two dimensional plane running perpendicular to the z-axis.

The magnetic vector potential A at a given position for each virtual current can be calculated through the following equation (based on Ampere's circuital law):

$$A = \frac{\mu_0 I}{2\pi} \ln(r)$$

where:
$\mu_0$ is the vacuum permeability;
I is the current passing through the virtual filament; and
r is the radial distance to the virtual filament.

As discussed above, the virtual current may be constrained to run parallel to the z-axis (to the axle of the motor). Similarly, the simulated currents of the coils within the motor may be modelled as straight currents filaments running parallel to the z-axis.

Based on the above, a vector can be assembled containing the magnetic vector potentials generated by each coil $U=(U_0, \ldots, U_{n-1})$ at each of a number of n locations within the motor. This calculation can use the same equation as for the magnetic vector potential A for each virtual current, as each coil can be modelled as one or more straight wires passing parallel to the axle (parallel to the virtual currents). This system of equations is then solved to find the virtual currents that create the correct magnetic vector potential $E=(E_0, \ldots, E_{n-1})$ as determined by previous simulation methods (e.g. FEM or BEM):

$$MI = E - U$$

where:
M is an n×m interaction matrix for calculating the magnetic vector potential at n locations (where n≥m);
I is a vector of m virtual currents $I=(I_0, \ldots, I_{m-1})$;
E is a vector of magnetic vector potentials for n locations as calculated by a simulation method (e.g. FEM or BEM); and
U is a vector of magnetic vector potentials for n locations as would be generated by the coils.

The interaction matrix M is made up of elements $M_{ij}$ (where i is a row index and j is a column index) which are equal to:

$$M_{ij} = \frac{\mu_0 I}{2\pi} \ln(r)$$

where i≠j; and $$M_{ij} = \frac{\mu_0}{8\pi}$$

where i=j.

The values of current in each virtual filament can be obtained by fitting methods (e.g. a least square method).

The number and position of the n sampling locations can be varied. In one embodiment, the number of sampling locations n may be equal to the number of virtual currents m (n=m). In this case, the sampling locations may be set to be the same as the virtual current locations (although the positions need not overlap). Having said this, since the vector potential can be calculated at any point in the motor, more equations for the vector potential caused by the virtual current filaments can be constructed than the number of unknowns within the system (i.e, the number of virtual currents). That is, the number of sampling locations n may be greater than the number of virtual currents m. Increasing the number of sampling locations n increases the accuracy of the fitting methods, but also increases the complexity of the calculations.

The above description relates to the modelling of magnetic fields within a 2D environment based on modelling all currents (both virtual and simulated) as straight line filaments running parallel to the axle of the motor. This offers advantages in terms of computational complexity when fitting the virtual currents, and the simplification of later calculations (e.g. calculating subsequent forces within the device), particularly where there is homogeneity along one axis. Nevertheless, the methodology described herein can equally be applied to a 3D simulated environment. In this case, each virtual current can still be modelled as a straight line filament; however, as the direction is perpendicular to the surface through of the device through which it passes, the direction of the virtual currents will need to be accounted for. Furthermore, the currents of any coils or other simulated currents within the device may need to be modelled through alternative equations (such as the magnetic field or magnetic vector potential generated from a coil).

Once the virtual currents have been solved/fitted, then the result of the full magnetic (e.g. FEM/BEM) simulation can be discarded, since all the field properties can be reconstructed using only virtual currents. Any time domain simulation (i.e. time dependent change of input currents to the coils) can now be effectively simulated using the virtual current representation as well without a need for the magnetic field to be fully re-simulated (e.g. via FEM) as long as the geometry of the electric motor remains unchanged.

Notably, by fitting the virtual currents to the magnetic field, the effect of the structure of the motor on the magnetic fields can be discarded. That is, subsequent calculations can be performed as if the magnetic field were operating in a vacuum. This simplifies later calculations, by avoiding the need to consider how the material or geometric properties of the motor affect the magnetic field.

FIG. 3 shows a method for simulating operation of digital design to determine one or more performance parameters. This may relate to step 120 within FIG. 100, but may equally be performed independently of any update to the digital design 130.

Magnetic field data is obtained 122 representing the magnetic field pattern that would be generated through operation of the digital design of the electromagnetic device.

This can be calculated through computational simulation methods, such as BEM or FEM. Inputs to this simulation may include one or more design parameters defining: the geometry of the electromagnetic device, the material properties of the electromagnetic device, and/or any inputs for driving the electromagnetic device. For instance, for a motor, the input may be current input(s) to one or more coils. For a generator, the input may be a torque input.

The magnetic field data is then converted into virtual current data 124. This is achieved by selecting locations for a number of virtual current filaments and adjusting an estimated current flowing through each virtual current filament such that the magnetic field that would be generated by the virtual current filaments matches, at least to a given level of precision, the simulated magnetic field. As discussed above, this can be achieved through fitting methods (regression analysis), such as least squares fitting.

Following the conversion, one or more performance parameters may be determined based on the virtual current data 126. Alternatively, or in addition, the virtual current data may be stored for later use, or output to another device for subsequent processing.

Examples of performance parameters that could be calculated include one or more electromagnetic performance parameters; one or more mechanical performance parameters; one or more thermal performance parameters; and one or more energy performance parameters.

One or more electromagnetic performance parameters may include magnetic flux density, magnetic field strength, magnetic vector potential and/or current generated (e.g. as eddy currents within the device or as usable current output from a generator). One or more mechanical performance parameters may include torque, one or more forces acting on a rotor and/or one or more forces acting on a stator. One or more thermal performance parameters may include heat generated (e.g. through friction and/or conduction). One or more energy performance parameters may include energy loss, power generated (e.g. as mechanical output or electrical output) and/or efficiency.

For instance, where the electromagnetic device is a motor, the one or more performance parameters may include torque generated by the motor, power output by the motor and/or efficiency (the ratio of energy output to energy input). Where the electromagnetic device is a generator, then the one or more performance parameters may include current generated, power or energy output and/or efficiency (the ratio of energy output to energy input).

Where the electromagnetic device has moving parts (such as a rotor and stator in a generator or motor), the magnetic field may be simulated for each of a set of predefined geometrical configurations (e.g. rotational orientations) and the virtual current data may be determined for each geometrical configuration. Equally, the performance parameters may be determined either for each geometrical configuration, to provide a waveform over time (e.g. torque over time, current generated over time, etc.), or calculated across the geometrical configurations to provide overall performance (e.g. total energy output, efficiency, etc.)

By converting the magnetic field data to virtual current data, the magnetic field can be represented more efficiently. This allows the magnetic field to be stored more efficiently, and for subsequent calculations based on the magnetic field to be performed more efficiently. For instance, by converting the magnetic field to virtual current data, a full representation of the magnetic field can be loaded onto memory-limited hardware, such as a GPU or CPU, for later calculations. Without this conversion, the magnetic field would need to be accessed from larger storage devices, which makes subsequent calculations more difficult to implement.

The conversion can be considered a form of parameterization, with the magnetic field being parameterized based on a set of virtual currents that produce an equivalent field. Each virtual current can be represented as a position and amount of current (in a 2D scenario) or as a vector (position and direction) and a current (in a 3D scenario). These two scenarios shall be discussed further below.

When fitting the virtual currents to the magnetic field, the number and position of the virtual currents needs to be determined. These can either be predetermined (e.g. as hyperparameters) or can be estimated as part of the fitting process. As part of this, the position of the virtual currents can be limited, to reduce the area being searched. For instance, the position of the virtual currents can be limited to positions along one or more edges of the geometry of the electromagnetic device (1D), positions along one or more surfaces of the geometry of the electromagnetic device (2D)

or positions within one or more volumes of the geometry of the electromagnetic device. Each virtual current may be restricted such that it must pass through a solid portion (e.g. a magnetic portion) of the electromagnetic device. In each scenario, the direction of each virtual current may be restricted to be perpendicular to a surface through which the virtual current passes (parallel to a normal of the geometry of the electromagnetic device). In addition, the virtual currents may be evenly distributed, or unevenly distributed across the electromagnetic device.

In one particular embodiment, the distribution of the virtual currents may be estimated, in addition to the size of the virtual currents. This may be performed through a grid search method.

Figure 4:
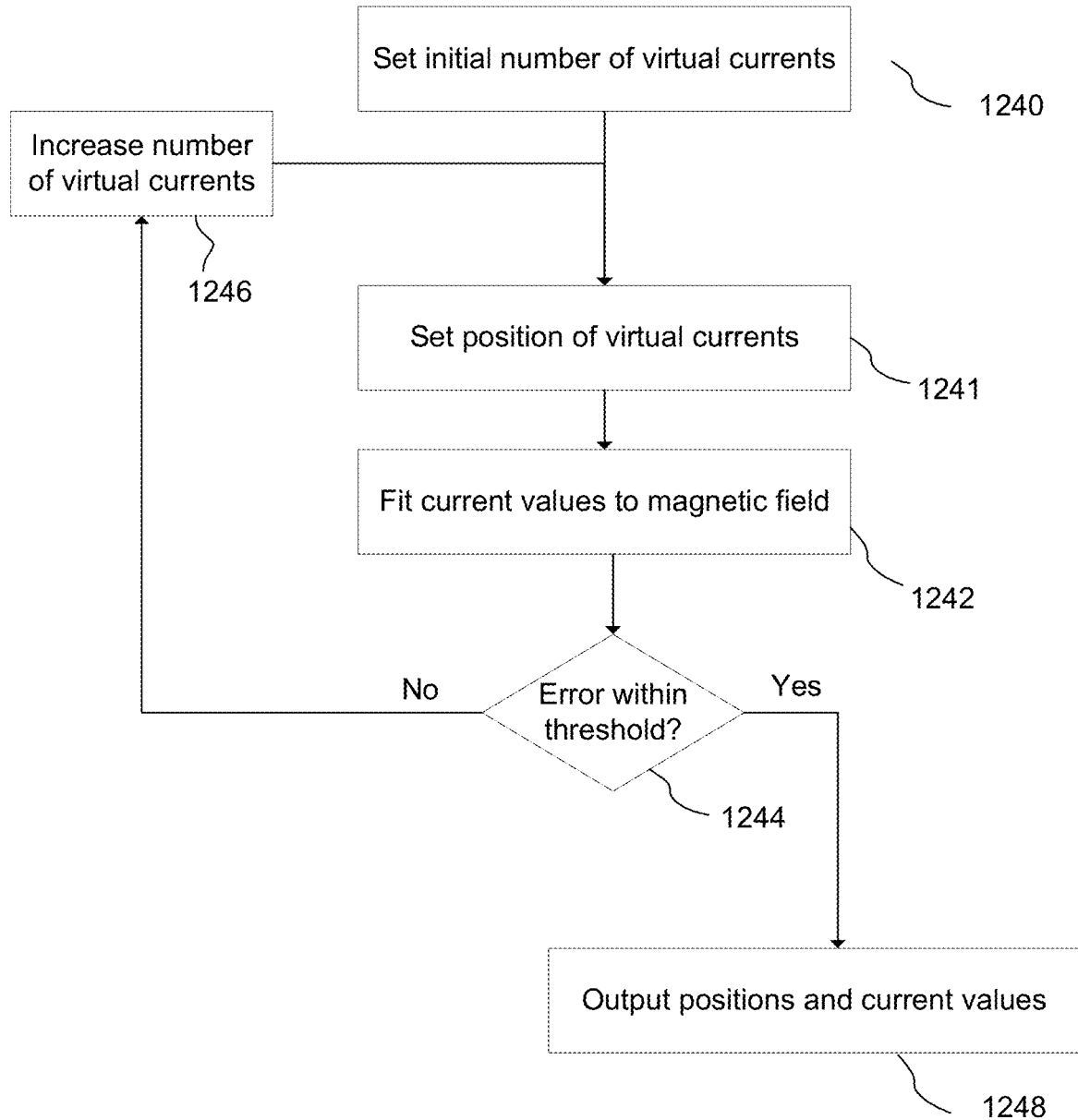
FIG. 4 shows a method for fitting virtual currents to a magnetic field, including determining a distribution of the virtual currents.

FIG. 4 shows a method for fitting virtual currents to a magnetic field, including determining a distribution of the virtual currents. This may be implemented as step 124 within the method of FIG. 3, although it could also be implemented independently of the determination of any performance parameters.

An initial number of virtual currents is set 1240. This may be predefined as a hyperparameter. A position is then determined for each virtual current 1241. A direction for each virtual current may also be defined at this point. The current value for each virtual current is then fit to the magnetic field 1242. That is, the current values are adjusted to attempt to fit the magnetic field that would be generated by the virtual currents to the previously calculated magnetic field. This may be through regression analysis that might attempt to minimize a difference (an error) between the two simulated magnetic fields.

It is then determined if the error is within a given threshold 1244. If so, then the current values, positions (and any directions) are output 1248. If the error is not within a threshold, then the number of virtual currents is increased 1246 and steps 1241-1244 are repeated based on the increased number of virtual currents.

When a new virtual current is added, it may be placed randomly, or may be positioned based on an error distribution. For instance, a region within the simulated magnetic device having a high error may be detected and an additional virtual current may added to this region. For instance, a grid-search method may be implemented. That is, the electromagnetic device may be divided into regions (or grids), and each region may be assigned a corresponding virtual current. If the error within a given region is higher than a given threshold, then the region may be split into sub-regions, and virtual currents may be assigned to each sub-region. The method may then repeat for the new regions (and sub-regions).

Alternatively to applying a set threshold for each region, a threshold may be applied to the error across the whole device, and then a predefined number of the regions having the highest error may be split.

Alternatively, where an even distribution of virtual currents is maintained, then adding a new virtual current may result in remaining virtual currents being repositioned to ensure an even distribution.

In addition or alternatively to the above, sufficiently small virtual currents may be pruned to reduce the size of the virtual current data and improve the efficiency of later computations. For instance, after fitting, any virtual currents that are less than a particular current threshold may be discarded. The current threshold may be a predefined threshold magnitude, or may be a relative threshold (e.g. a predefined ratio or percentage current relative to one or more other virtual currents, or an average virtual current).

Through the above methods, the number of location of virtual currents may be fit to provide an accurate representation of the magnetic field.

Once the magnetic field has been simulated, and the performance of the design assessed, the design may be output or modified to improve performance. That is, once the desired performance has been achieved (e.g. as evidenced by a predefined threshold for one or more performance parameters), then the design may be output (e.g. for manufacture). Physical parameters may be output to one or more manufacturing apparatus for manufacturing the product. Input parameters (e.g. one or more input current waveforms) may be stored in a controller to program the controller to control an input to an electromagnetic device to drive the device.

One or more designs according to the disclosure may be manufactured either manually or using an automated or semi-automated manufacturing process. For example, a production line and/or one or more manufacturing devices, such as additive manufacturing devices, robotic apparatus, etc., may be controlled to manufacture a design.

Manufacturing processes typically fabricate components based on three-dimensional (3D) information, for example a three-dimensional computer model (or design file), of the component.

Accordingly, examples described herein not only include methods for designing products or components as described herein, but also methods of manufacturing such products or components via manufacturing and computer software, firmware or hardware for controlling the manufacture of such products.

The structure of one or more parts of the product may be represented digitally in the form of a design file. A design file, or computer aided design (CAD) file, is a configuration file that encodes one or more of the surface or volumetric configuration of the shape of the product. That is, a design file represents the geometrical arrangement or shape of the product.

Design files can take any now known or later developed file format. For example, design files may be in the Stereolithography or "Standard Tessellation Language" (.stl) format which was created for stereolithography CAD programs of 3D Systems, or the Additive Manufacturing File (.amf) format, which is an American Society of Mechanical Engineers (ASME) standard that is an extensible markup-language (XML) based format designed to allow any CAD software to describe the shape and composition of any three-dimensional object to be fabricated.

Further examples of design file formats include AutoCAD (.dwg) files, Blender (.blend) files, Parasolid (.x_t) files, 3D Manufacturing Format (.3mf) files, Autodesk (3ds) files, Collada (.dae) files and Wavefront (.obj) files, although many other file formats exist.

Design files can be produced using modelling (e.g. CAD modelling) software and/or through scanning the surface of a product to measure the surface configuration of the product.

Once obtained, a design file may be converted into a set of computer executable instructions that, once executed by a processor, cause the processor to control an manufacturing apparatus to produce a product or a portion of a product according to the geometrical arrangement specified in the design file. The instructions (otherwise known as geometric code or "G-code") may be calibrated to the specific manufacturing apparatus.

The code or instructions may be translated between different formats, converted into a set of data signals and transmitted, received as a set of data signals and converted to code, stored, etc., as necessary. A manufacturing system may execute the instructions to fabricate the product using any of the technologies or methods disclosed herein.

Design files or computer executable instructions may be stored in a (transitory or non-transitory) computer readable storage medium (e.g., memory, storage system, etc.) storing code, or computer readable instructions, representative of the product to be produced. As noted, the code or computer readable instructions defining the product that can be used to physically generate the object, upon execution of the code or instructions by a manufacturing system.

Accordingly, by controlling a manufacturing apparatus according to the computer executable instructions, the manufacturing apparatus can be instructed to manufacture one or more parts of the product. These can be manufactured either in assembled or unassembled form. For instance, different sections of the product may be manufactured separately (as a kit of unassembled parts) and then subsequently assembled. Alternatively, the different parts may be manufactured in assembled form.

In one embodiment, the magnetic field simulation may be used to identify and/or diagnose errors within a real-world version of the electromagnetic device. The simulation may be loaded onto a processor and run in parallel to running and monitoring the electromagnetic device in the real world. Input parameters to the real-world device may be input into the simulated device in order to simulate performance of the device. The system may monitor for a divergence in one or more performance or evaluation parameters (between the real world and simulated devices). Where a divergence is detected (e.g. greater than a threshold amount), then an alert may be issued to indicate that the real world device is operating unexpectedly. Where the real world device is performing worse than the simulated device, then this alert may indicate that the real world device is operating poorly (e.g. that the real world device may be damaged).

In light of the above, embodiments include methods of manufacture. This includes the steps of obtaining a design file representing the product and instructing a manufacturing apparatus to manufacture the product in assembled or unassembled form according to the design file. The additive manufacturing apparatus may include a processor that is configured to automatically convert the design file into computer executable instructions for controlling the manufacture of the product. In these embodiments, the design file itself can automatically cause the production of the product once input into the manufacturing device. Accordingly, in this embodiment, the design file itself may be considered computer executable instructions that cause the manufacturing apparatus to manufacture the product. Alternatively, the design file may be converted into instructions by an external computing system, with the resulting computer executable instructions being provided to the manufacturing device.

Figure 5:
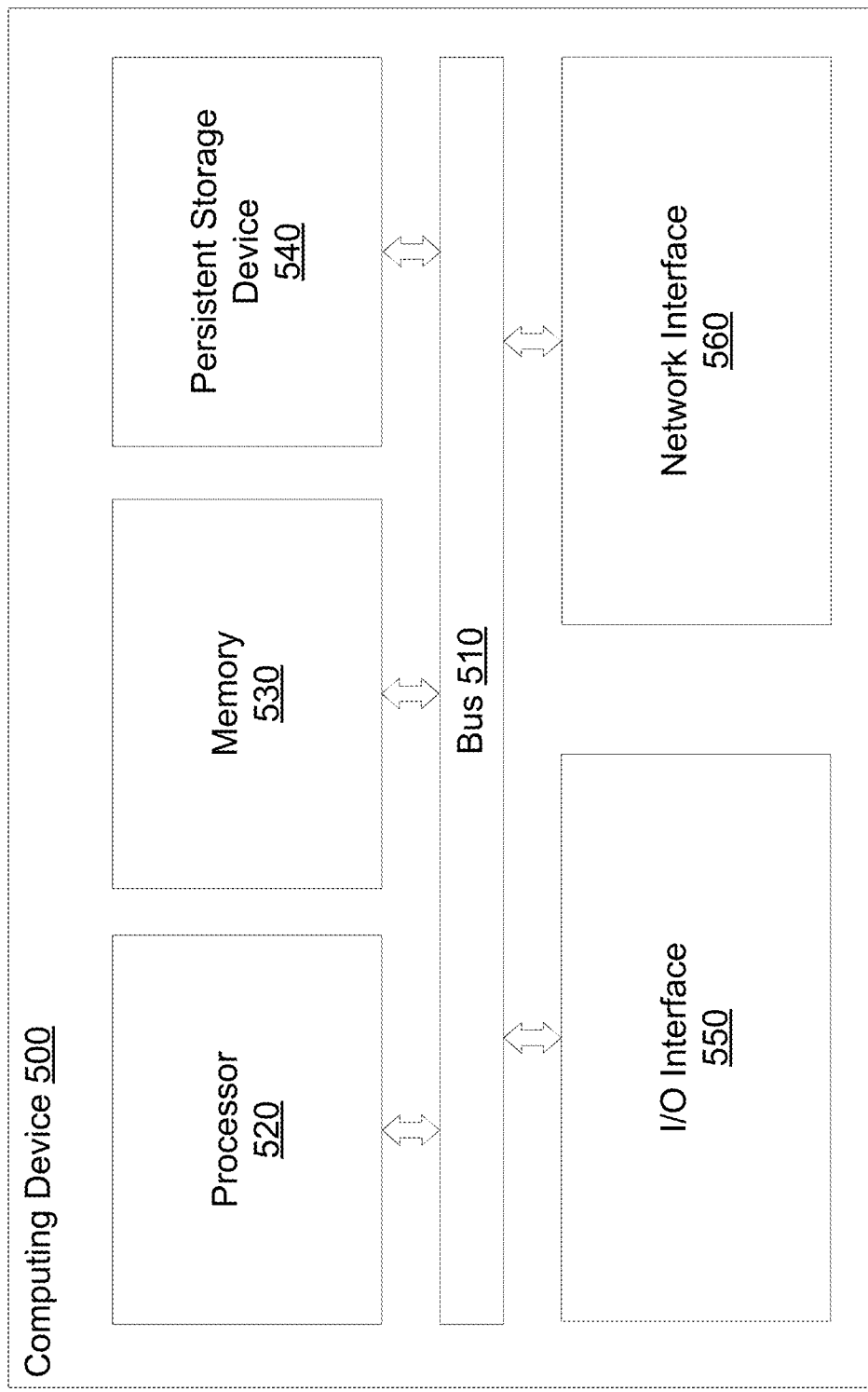
FIG. 5 shows a computing device 500 using which the embodiments described herein may be implemented.

FIG. 5 shows a computing device 500 using which the embodiments described herein may be implemented.

The computing device 500 includes a bus 510, a processor 520, a memory 530, a persistent storage device 540, an Input/Output (I/O) interface 550, and a network interface 560.

The bus 510 interconnects the components of the computing device 500. The bus may be any circuitry suitable for interconnecting the components of the computing device 500. For example, where the computing device 500 is a desktop or laptop computer, the bus 510 may be an internal bus located on a computer motherboard of the computing device. As another example, where the computing device 500 is a smartphone or tablet, the bus 510 may be a global bus of a system on a chip (SoC).

The processor 520 is a processing device configured to perform computer-executable instructions loaded from the memory 530. Prior to and/or during the performance of computer-executable instructions, the processor may load computer-executable instructions over the bus from the memory 530 into one or more caches and/or one or more registers of the processor. The processor 520 may be a central processing unit with a suitable computer architecture, e.g. an x86-64 or ARM architecture. The processor 520 may include or alternatively be specialized hardware adapted for application-specific operations.

The memory 530 is configured to store instructions and data for utilization by the processor 520. The memory 530 may be a non-transitory volatile memory device, such as a random access memory (RAM) device. In response to one or more operations by the processor, instructions and/or data may be loaded into the memory 530 from the persistent storage device 540 over the bus, in preparation for one or more operations by the processor utilising these instructions and/or data.

The persistent storage device 540 is a non-transitory non-volatile storage device, such as a flash memory, a solid state disk (SSD), or a hard disk drive (HDD). A non-volatile storage device maintains data stored on the storage device after power has been lost. The persistent storage device 540 may have a significantly greater access latency and lower bandwidth than the memory 530, e.g. it may take significantly longer to read and write data to/from the persistent storage device 540 than to/from the memory 530. However, the persistent storage 540 may have a significantly greater storage capacity than the memory 530.

The I/O interface 550 facilitates connections between the computing device and external peripherals. The I/O interface 550 may receive signals from a given external peripheral, e.g. a keyboard or mouse, convert them into a format intelligible by the processor 520 and relay them onto the bus for processing by the processor 520. The I/O interface 550 may also receive signals from the processor 520 and/or data from the memory 530, convert them into a format intelligible by a given external peripheral, e.g. a printer or display, and relay them to the given external peripheral.

The network interface 560 facilitates connections between the computing device and one or more other computing devices over a network. For example, the network interface 560 may be an Ethernet network interface, a Wi-Fi network interface, or a cellular network interface.

Given the above, the design and manufacture of implementations of the subject matter and the operations described in this specification can be realized using digital electronic circuitry, or in computer software, firmware, or hardware, including the structures disclosed in this specification and their structural equivalents, or in combinations of one or more of them. For instance, hardware may include processors, microprocessors, electronic circuitry, electronic components, integrated circuits, etc. Implementations of the subject matter described in this specification can be realized using one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

While certain arrangements have been described, the arrangements have been presented by way of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. A computer-implemented method for simulating a magnetic field within an electromagnetic device for use in evaluating the electromagnetic device, the method comprising:
    obtaining magnetic field data representing a magnetic field pattern that would be generated through operation of the electromagnetic device; and
    converting the magnetic field data into virtual current data, wherein the virtual current data represents the magnetic field pattern as one or more virtual currents that would create an estimated magnetic field pattern that substantially matches the magnetic field pattern;
    wherein converting the magnetic field data into virtual current data comprises fitting the estimated magnetic field pattern to the magnetic field pattern by varying one or more virtual current parameters, the one or more virtual current parameters being selected from a group comprising,
    a number of virtual currents;
    for each virtual current, a position of the virtual current;
    for each virtual current, a direction of the virtual current; and
    for each virtual current, a current magnitude.

2. The method of claim 1 wherein:
    the method further comprises obtaining a digital design of the electromagnetic device, the digital design comprising geometric data representing a geometry of the electromagnetic device and material data representing material properties of the electromagnetic device; and
    the one or more virtual currents comprise one or more virtual current filaments, each virtual current filament being a straight filament running perpendicular to a corresponding surface of the electromagnetic device through which the virtual current filament passes.

3. The method of claim 1 wherein fitting the estimated magnetic field pattern to the magnetic field pattern comprises adjusting the one or more virtual current parameters to minimize an error between the estimated magnetic field pattern and the magnetic field pattern.

4. The method of claim 3 wherein fitting the estimated magnetic field pattern to the magnetic field pattern comprises, in response to determining that the error exceeds an error threshold, increasing a number of virtual currents and refitting the estimated magnetic field pattern based on the increased number of virtual currents.

5. The method of claim 4 wherein increasing a number of virtual currents comprises:
    identifying one or more regions in which a corresponding local error between the estimated magnetic field pattern and the magnetic field pattern either exceeds a local error threshold or is higher than a predefined number or proportion of other regions; and
    for each identified region, increasing a number of virtual currents within the identified region.

6. The method of claim 1 further comprising:
    obtaining a digital design of the electromagnetic device, the digital design comprising geometric data representing a geometry of the electromagnetic device and material data representing material properties of the electromagnetic device; and
    determining, based on the virtual current data, one or more performance parameters for the digital design of the electromagnetic device, the one or more performance parameters representing performance of the electromagnetic device through an interaction between the electromagnetic device and the estimated magnetic field pattern represented by the virtual current data, the one or more performance parameters being selected from a group comprising,
    one or more electromagnetic performance parameters;
    one or more mechanical performance parameters;
    one or more thermal performance parameters; and
    one or more energy performance parameters.

7. The method of claim 6 further comprising determining an updated digital design for the electromagnetic device, wherein determining the updated digital design comprises altering one or more design parameters of the electromagnetic device based on the one or more performance parameters, the one or more design parameters being selected from a group comprising,
    the geometry of the electromagnetic device;
    the material properties of the electromagnetic device; and
    an input for driving the electromagnetic device.

8. The method of claim 7 wherein determining an updated digital design for the electromagnetic device comprises one or more optimization steps that adjust at least one of the one or more design parameters with an objective of improving at least one of the one or more performance parameters.

9. The method of claim 8 further comprising outputting the updated digital design of the electromagnetic device for manufacture.

10. The method of claim 8 further comprising controlling one or more manufacturing devices to manufacture one or more electromagnetic devices according to the updated digital design.

11. A method of designing and manufacturing an electromagnetic device comprising:
    implementing the method of claim 7 to determine an updated digital design; and
    manufacturing an electromagnetic device according to the updated digital design.

12. The method of claim 1 further comprising obtaining a digital design of the electromagnetic device, the digital design comprising geometric data representing a geometry of the electromagnetic device and material data representing material properties of the electromagnetic device, wherein the electromagnetic device is an electric motor or an electric generator.

13. The method of claim 12 wherein:

the electromagnetic device comprises a stator and a rotor;

the geometric data represents multiple geometries of the electromagnetic device, each geometry relating to one of a plurality of relative orientations of the stator and rotor;

obtaining magnetic field data representing a magnetic field pattern that would be generated through operation of the electromagnetic device comprises obtaining, for each of a plurality of relative orientations of the stator and rotor, magnetic field data representing a magnetic field pattern for the corresponding relative orientation of the stator and rotor; and converting the magnetic field data comprises converting each magnetic field pattern into corresponding virtual current data representing the magnetic field pattern as one or more virtual currents that would create an estimated magnetic field pattern that substantially matches the corresponding magnetic field pattern.

14. A computing system comprising one or more processors configured to:

obtain magnetic field data representing a magnetic field pattern that would be generated through operation of the electromagnetic device; and convert the magnetic field data into virtual current data, wherein the virtual current data represents the magnetic field pattern as one or more virtual currents that would create an estimated magnetic field pattern that substantially matches the magnetic field pattern;

wherein converting the magnetic field data into virtual current data comprises fitting the estimated magnetic field pattern to the magnetic field pattern by varying one or more virtual current parameters, the one or more virtual current parameters being selected from a group comprising, a number of virtual currents;

for each virtual current, a position of the virtual current;

for each virtual current, a direction of the virtual current; and for each virtual current, a current magnitude.

15. A non-transitory computer readable medium comprising executable instructions that, when executed by a processor, cause the processor to:

obtain magnetic field data representing a magnetic field pattern that would be generated through operation of the electromagnetic device; and convert the magnetic field data into virtual current data, wherein the virtual current data represents the magnetic field pattern as one or more virtual currents that would create an estimated magnetic field pattern that substantially matches the magnetic field pattern;

wherein converting the magnetic field data into virtual current data comprises fitting the estimated magnetic field pattern to the magnetic field pattern by varying one or more virtual current parameters, the one or more virtual current parameters being selected from a group comprising, a number of virtual currents;

for each virtual current, a position of the virtual current;

for each virtual current, a direction of the virtual current; and for each virtual current, a current magnitude.

* * * * *